United States Patent [19]

Griffith et al.

[11] 4,298,237
[45] Nov. 3, 1981

[54] PRINTED WIRING BOARD INTERCONNECTION APPARATUS

[75] Inventors: Gary L. Griffith, Arvada; Charles J. Sherman, Westminster, both of Colo.

[73] Assignee: Bell Telephone Laboratories, Incorporated, Murray Hill, N.J.

[21] Appl. No.: 105,501

[22] Filed: Dec. 20, 1979

[51] Int. Cl.³ .............................................. H01R 13/64
[52] U.S. Cl. ........................... 339/17 L; 339/176 MP; 339/184 M
[58] Field of Search .......... 339/17 L, 17 LC, 17 LM, 339/17 M, 176 MP, 182, 184

[56] References Cited

U.S. PATENT DOCUMENTS

| | | | |
|---|---|---|---|
| 1,552,262 | 9/1925 | Betz | 339/184 R |
| 3,109,958 | 11/1963 | Delachapelle et al. | 339/17 T |
| 3,189,864 | 6/1965 | Angele et al. | 339/176 MP |
| 3,399,372 | 8/1968 | Uberbacher | 339/17 L |
| 3,465,891 | 9/1969 | De Rose | 339/17 LM |
| 3,980,388 | 9/1976 | Nailor | 339/184 R |
| 4,002,381 | 1/1977 | Wagner | 312/183 |
| 4,095,866 | 6/1978 | Merrill | 339/17 L |

FOREIGN PATENT DOCUMENTS

6714614 5/1968 Netherlands .

Primary Examiner—Joseph H. McGlynn
Attorney, Agent, or Firm—William H. Kamstra

[57] ABSTRACT

Interconnection apparatus for electrically connecting the contact areas (22) of a printed wiring board (20) and the contact springs (e.g., 33, 34) of a backplane (10) for increasing the board terminations without increasing the width of the board leading edge (21). A coordinate array of contact areas (22) is provided at least on one side of the leading portion of the board (20) which corresponds to an array of contacting surfaces of the springs (e.g., 33, 34) extending from a backplane (10). A mask (e.g., 23) having an array of apertures (24) corresponding to the contact area array overlies the leading portion (21) of the board (20). The mask apertures (e.g., 24) are individually dimensioned and formed within the array rows to accept therethrough only correspondingly formed individual contact springs (e.g., 33, 34) of the spring rows. Accordingly, as the board (20) is inserted in opposition to the contact springs, individual ones of the latter can only make electrical contact with their corresponding board (20) contact areas (22) when the board is fully inserted, the spring and contact area mating then occurring simultaneously.

17 Claims, 8 Drawing Figures

PRINTED WIRING BOARD INTERCONNECTION APPARATUS

TECHNICAL FIELD

This invention relates to electrical interconnection apparatus and particularly to such apparatus for interconnecting electrical assemblies, such as printed wiring boards, for example, and other electrical system components and circuits.

BACKGROUND OF THE INVENTION

Printed wiring boards and their mounting frames of the character described, for example, in U.S. Pat. No. 4,002,381 of D. R. Wagner et al., issued Jan. 11, 1977, are well-known in the art and have long provided an advantageous means for assembling and mounting relatively large numbers of electrical components. Typically, circuits extending from the components in the form of wiring printed on the board are extended to terminal contact areas arranged along a leading edge of the board. These terminal areas are spaced to mate with corresponding contact springs of a connector into which the leading edge of the board is inserted. Suitable frames and racks are provided to support a number of the boards and also provide a means for guiding the boards for their insertion in and removal from the respective connectors. The connectors are in turn adapted to mate with pins extending from a backplane or with other interconnection apparatus as is also known. In order to achieve an orderly physical organization, the dimensions of the printed wiring boards are generally standardized within a given system and may even be so standardized among various suppliers. Although convenient from an interchangeability viewpoint, the fixed dimensions of a board within a given system and particularly the dimension of the board leading edge, ultimately imposes a severe limitation on the number of terminal contact areas which may be provided. This in turn limits the number of electrical components and circuits which may be mounted on the board notwithstanding the available board mounting area.

One obvious expedient in providing more board leading edge terminal contact areas is to decrease their widths and spacings; this measure, however, is temporary as minimum limits of the contact areas and spacings are approached. Additional columns of contact areas have in the past also been provided inwardly from the board leading edge, the resulting array of contact areas then being adapted to mate with multiple tiers of connector springs. Although significantly increasing the number of circuit board terminations, the latter arrangement presents a problem not encountered in connection with boards having a single leading edge column of terminal contact areas. When a single column board is inserted in its connector, each of its contact areas simultaneously makes electrical contact with its corresponding connector contact spring. No premature or erroneous electrical connections are normally possible during the time the board is being inserted. In a multi-column contact arrangement, on the other hand, the connector contact springs adapted to make electrical connections with the contact areas of the circuit board beyond the first column of necessity pass each contact area of the preceding columns. Were the connector contact springs actually to wipe such preceding column board contact areas, serious damage could be done to board circuit components where the connector springs are included in active circuits. It is thus necessary in many system applications that the connector contact springs make selective and simultaneous electrical contact with their respective circuit board terminal contact areas. It is to the problem of achieving such selective and simultaneous contact that the apparatus of this invention is chiefly directed.

SUMMARY OF THE INVENTION

The foregoing objective is realized and a technical advance is achieved in accordance with the principles of this invention in printed wiring board-connector apparatus in which the board and connector contact area and spring pairs make selective and simultaneous electrical contact only when the board completes full insertion in its connector. As exemplified in various specific embodiments, the apparatus of the invention broadly comprises a printed wiring board having a coordinate array of terminal contact areas affixed at its leading edge portion at least on one side, the columns being arranged inwardly from the leading edge. The board is adapted for insertion in a connector housing supporting a corresponding array of contact springs arranged to mate with respective board contact areas. The springs conventionally terminate in pins adapted and spaced for insertion in via holes of a backplane or other electrical interconnection apparatus. According to the invention, as the board is inserted into its connector housing, simultaneous and exclusive mating of its contact areas and the housing contact springs is achieved at the completion of the insertion by a mask overlaying the contact area array. The mask has formed therein a coordinate array of rectangular apertures which array corresponds to the array of board contact areas. In one embodiment, the mask aperture lengths progressively increase along the array rows from the board leading edge. The housing contact springs have their points of contact in the same plane but the radii of curvature of their contact surfaces increase from tier to tier. As the board is inserted in the housing along the spring sets, the increasing curvature prevents contact with the board contact areas until the mask aperture lengths permit access to the spring contact surface curvature. Simultaneous and selective mating of the board contact areas and connector housing contact springs is thus ensured.

In a second illustrative embodiment, the widths of the mask apertures progressively increase rather than the lengths along the rows. The widths of the connector housing springs correspondingly increase rather than their radii of curvature. As a result, the springs seat only on the board contact areas at the mask apertures having corresponding admissible widths. In another specific embodiment, the connector housing contact springs also have increasing radii of contact surfaces which selectively engage the board contact areas through the mask apertures as the result of a gradual decrease in the thickness of the mask and varying tapers of the aperture walls.

In each of the specific illustrative arrangements of the interconnection apparatus of the invention, advantageously any active circuits presented by the connector housing contact springs are completed exclusively with the desired printed wiring board circuits and components.

BRIEF DESCRIPTION OF THE DRAWING

The organization and operation of the electrical interconnection apparatus according to this invention together with its features will be better understood from a consideration of the detailed description of illustrative embodiments thereof which follows when taken in conjunction with the accompanying drawing in which.

DETAILED DESCRIPTION

Figure 1:
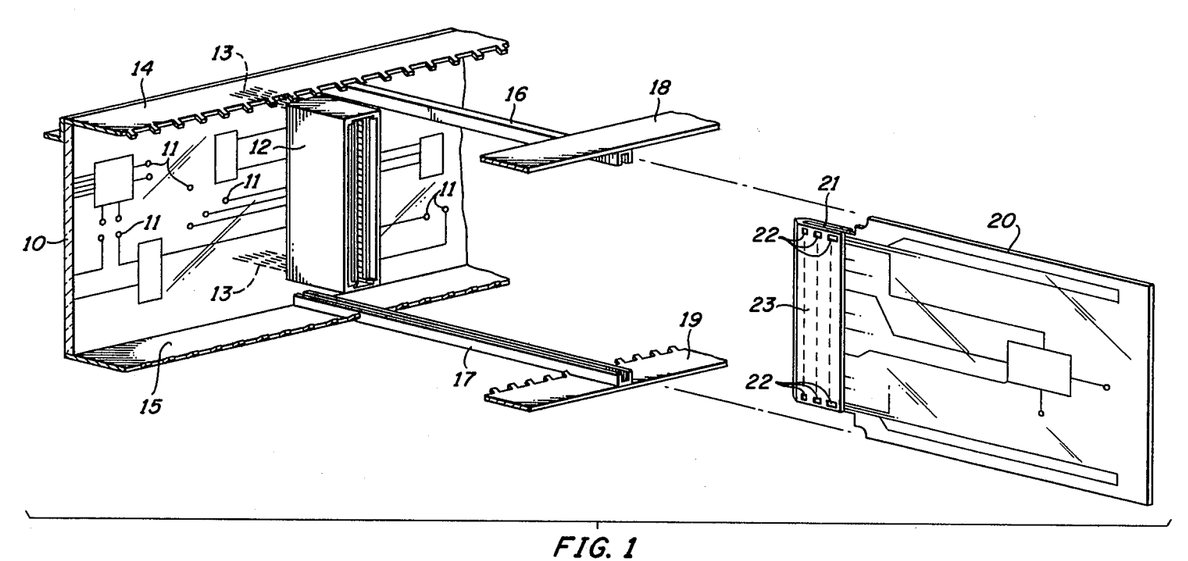
FIG. 1 depicts a representative backplane connector organization showing a connector housing and a printed wiring board according to the invention, the connector housing being shown in place at the backplane in relation to portions of a frame assembly and the wiring board being shown in alignment with guide rails preparatory to its insertion therebetween.
Figure 2:
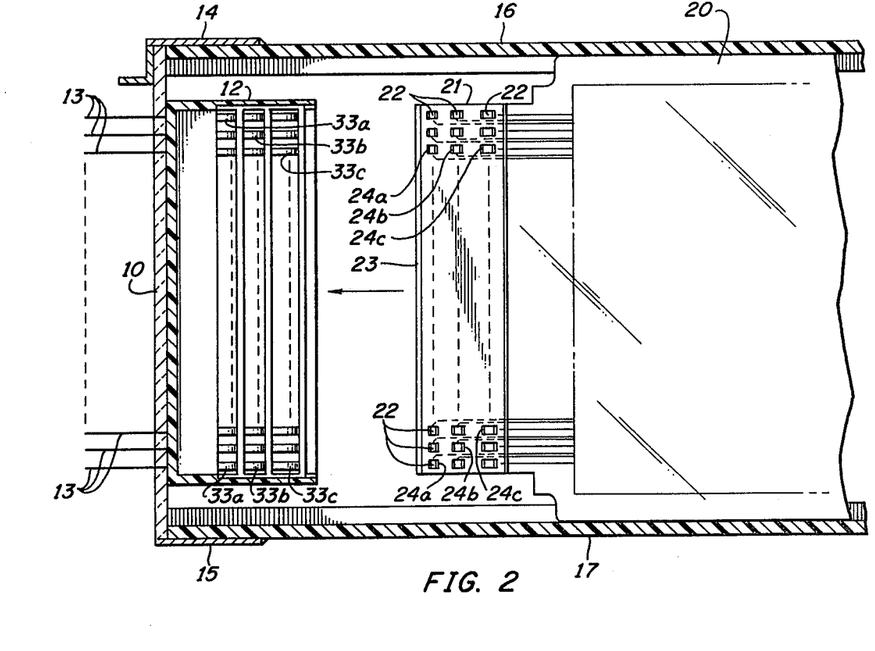
FIG. 2 is an enlarged view of the printed wiring board of FIG. 1 shown in place between sectioned guide rails preparatory to its final movement into association with a connector contact spring housing, the view showing the contact area face of the board.

A portion of a typical backplane interconnection organization in which a connector-printed wiring board apparatus of the invention is advantageously adapted for use is depicted in FIG. 1. This organization may comprise a backplane 10 which itself may have mounted thereon printed wiring interconnecting an array of via holes 11 adapted to receive the pins of a printed wiring board connector. A single illustrative connector housing 12 having representative pins 13 so inserted in holes 11 is shown mounted on the backplane 10 between a pair of frame members 14 and 15 and a pair of guide rails 16 and 17. Guide rails 16 and 17 are mounted at one end between frame members 14 and 15, respectively, and at the other end between other frame members 18 and 19, representative portions of which are shown in the figure. A printed wiring board 20 featuring a leading edge portion 21 according to specific embodiments of the invention is shown in alignment with guide rails 16 and 17 preparatory to its insertion therebetween. A board 20, a specific illustrative one of which is also known in enlarged view of FIG. 2 as partially inserted between rails 16 and 17, has affixed thereto at leading edge portion 21 on each side a coordinate array of terminal contact areas 22. The latter are typically connected by means of printed wiring to circuits and components mounted on the remaining portions of the board. Also mounted on board 20 or comprising an integral part thereof at its end portion 21 is a mask 23 enclosing the arrays of contact areas 22 on both sides of the board. Board 20 is shown in FIG. 2 between sectioned guide rails 16 and 17 in a position just before its final insertion in its connector housing 12. Details of the latter housing and its mating with board 20 are more clearly shown in FIGS. 3 and 4 to which figures reference may now be had together with the view of FIG. 2.

Figure 3:
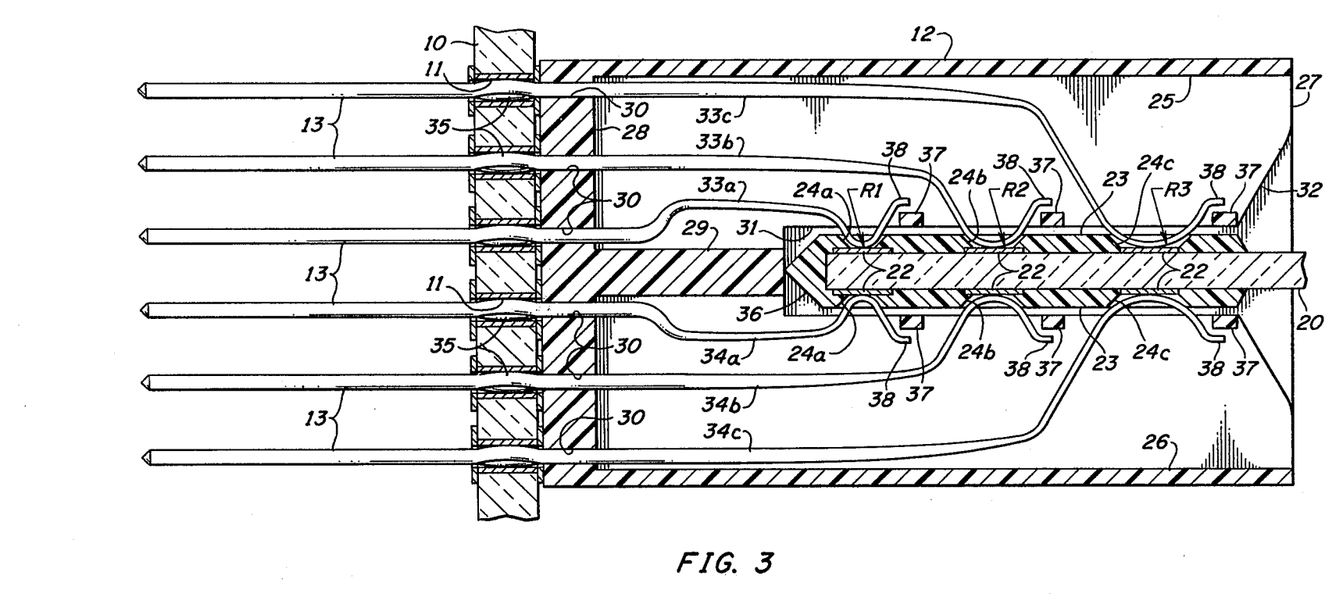
FIG. 3 is an enlarged section view of one specific illustrative connector arrangement according to the invention.

As shown in FIG. 2 and more specifically in FIG. 3, where board 20 is shown fully inserted in connector housing 12, mask 23 is provided with coordinate arrays of apertures 24 on each side of board 20 corresponding in arrangement and position to contact areas 22 on each side of board 20. One row of each of the arrays of contact areas and mask apertures is shown in FIG. 3, each row of apertures comprising representative apertures 24a, 24b, and 24c. Apertures 24 are dimensioned equal in width and to conform to the widths of board contact areas 22. In length, that is, the dimension inward from the leading edge of board 20, on the other hand, mask apertures 24 successively increase in dimension. Thus, in the specific embodiment shown, the aperture lengths increase from the shortest dimension of apertures 24a to the longest of apertures 24c. As will become apparent hereinafter, the increasing lengths of mask 23 apertures 24 makes possible a selective and simultaneous engagement with contact springs of connector housing 12.

Housing 12, only a side section view of which is sufficient for an understanding of its organization, is formed of an electrically insulative material and comprises a top wall 25, a bottom wall 26, and side walls, only side wall 27 being visible in the figure. The enclosure of housing 12 is completed at one end by an end wall 28 having at its midpoint an outwardly extending shelf 29 which may conveniently constitute a stop for the insertion of board 20. End wall 28 is provided with an array of apertures 30 which correspond in arrangement and spacing to those of via holes 11 presented on backplane 10. Apertures 30, a single representative column of which is shown in FIG. 3, are dimensioned to have press-fitted therethrough the connector contact springs which terminate in pins 13 there shown as fitted in via holes 11 of backplane 10. The illustrative details of housing 12 further include a slot 31 formed in the side walls (see side wall 27) extending from shelf 29 to the open end of the housing and terminating in a broadly tapered access 32. Slot 31 is dimensioned to loosely received the masked end of board 20, the latter being firmly held in alignment by channeled guide rails 16 and 17.

Figure 4:
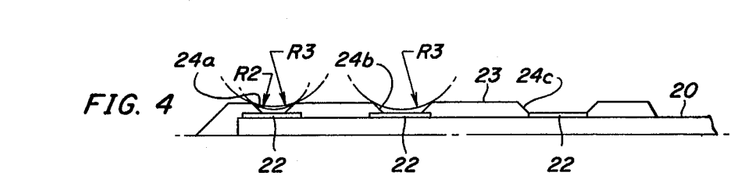
FIG. 4 is a diagrammatic partial view of the mask of the arrangement of FIG. 3 showing the relationship of the spring curvatures and mask aperture dimensions.

The illustrative connector housing 12 is provided with six tiers of contact springs, representative single springs 33a, 33b, and 33c of which are shown on one side of board 20 and representative single springs 34a, 34b, and 34c of which are shown on the other side of board 20. The springs individually extend outwardly from end wall 28 and are end-curved to coincide in position with mask apertures 24 of mask 23 and contact areas 22 of board 20. Springs 33 and 34, as mentioned hereinbefore, terminate in terminal pins 13 and are adapted to maintain positive electrical connection with via holes 11 of backplane 10 by split-beam sections 35, which sections are well-known. The widths of springs 33 and 34 at their end contact portion are equal, the width being determined so as to be freely admitted through any of the apertures 24 of mask 23, which apertures are also equal in width as mentioned in the foregoing. In accordance with the principles of the invention, the radii of curvature of the end contact portions of springs 33 and 34, on the other hand, are determined to correspond, respectively, to the lengths of apertures 24 of mask 23. Thus, the radii of curvature R1 of the contact portions of springs 33a and 34a are determined so as to permit access to contact areas 22 of board 20 through mask apertures 24a, the radii of curvature R2 of the contact portions of springs 33b and 34b are determined so as to permit access to contact areas 22 through the longer mask apertures 24b, and the radii of curvature R3 of the contact portions of springs 33c and 34c are determined so as to permit access to contact areas 22 through the still longer mask apertures 24c. With the radii thus determined, it is apparent, as indicated in the diagram of FIG. 4, that the curvature of springs 33c and 34c, R3 prevents their admittance through apertures 24a and 24b of mask 23 and, hence, electrical contact with the underlying contact areas 22 of board 20. Similarly, the curvature of springs 33b and 34b, R2, prevents their admission through apertures 24a of mask 23 and hence, electrical contact with the underlying contact areas 22. As a result, the opposing tiers of springs 33 and 34 can make contact with their corresponding contact areas 22 only when board 20 is fully inserted in housing 12, this contact then being made simultaneously for all contact springs. Insertion of board 20 between the spring tiers is facilitated by tapered access 32 and by providing a tapered edge 36 on mask 23. The springs are tensioned to ensure positive electrical contact with contact areas 22 through their corresponding apertures 24 and are prevented from contact with opposing springs when board 20 is removed from housing 12 by crossbars 37 extending between the side walls of the housing 12 on which crossbars extension 38 of springs 33 and 34 are adapted to rest. Although the coordinate arrays of board contact areas 22 and the spring tiers are shown as including three per row, it will be appreciated that the array rows may be expanded to provide for a reasonably greater number of contact areas-spring pairs.

Figure 5:
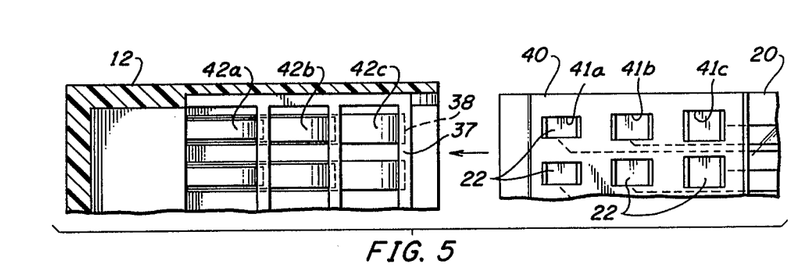
FIG. 5 depicts enlarged portions of a circuit board and connector spring relationship of another illustrative embodiment of the invention.
Figure 6:
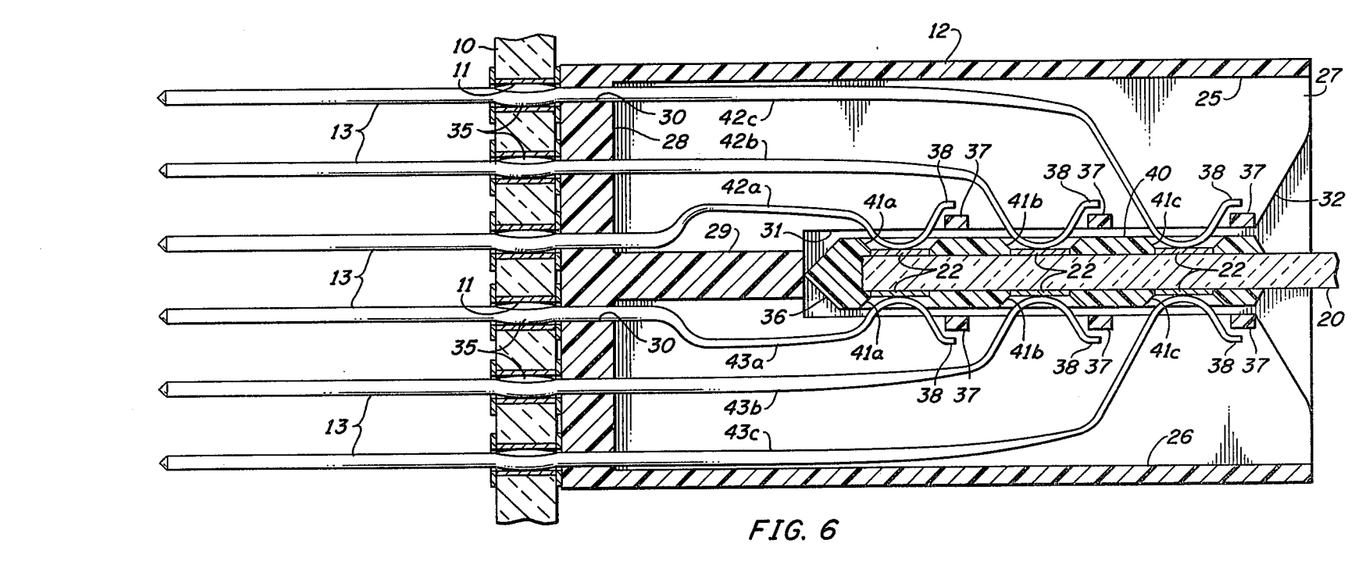
FIG. 6 is an enlarged section view of the illustrative connector arrangement of which enlarged portions are shown in FIG. 5.

Another specific illustrative embodiment within the scope of the invention is shown in FIGS. 5 and 6 in which elements identical to those of the embodiment described in the foregoing are designated by the same reference characters. Only so much of this embodiment will be described as necessary for an understanding of its features as compared to those of the embodiment previously described. Board 20 again has a coordinate array of contact areas 22 affixed thereon overlaid by a mask 40 which also is provided with a corresponding array of apertures 41. In this case, however, apertures 41 are of equal length as shown in the portional view of FIG. 5, the dimension of their widths increasing along the array rows inwardly from the leading edge of board 20. Thus, as represented by the top single row of three apertures, the widths increase from the narrowest of aperture 41a to the widest of aperture 41c. The radii of curvature of the contact portion of the contact springs of the double tier of opposing springs 42 and 43, in this case, remains constant and are determined for free admission with respect to the lengths of mask apertures 41. In this embodiment, the contact portions of springs 42 and 43 vary in width to correspond to the respective widths of apertures 41. Thus, as shown in FIG. 5, the width of the contact portion of a spring 42c is determined so as to be freely admitted in aperture 41c but is too wide for admittance in apertures 41b and 41a. Similarly, the contact portion of a spring 42b is determined so as to be freely admitted in a mask aperture 41b but is too wide for admittance in aperture 41a. Finally, the width of the contact portion of a spring 41a is determined so as to be freely admitted in an aperture 41a. Again, the opposing tiers of springs 42 and 43 can make contact with their corresponding contact areas 22 only when board 20 is fully inserted in housing 12, this contact then again being made simultaneously for all contact springs.

Figure 7:
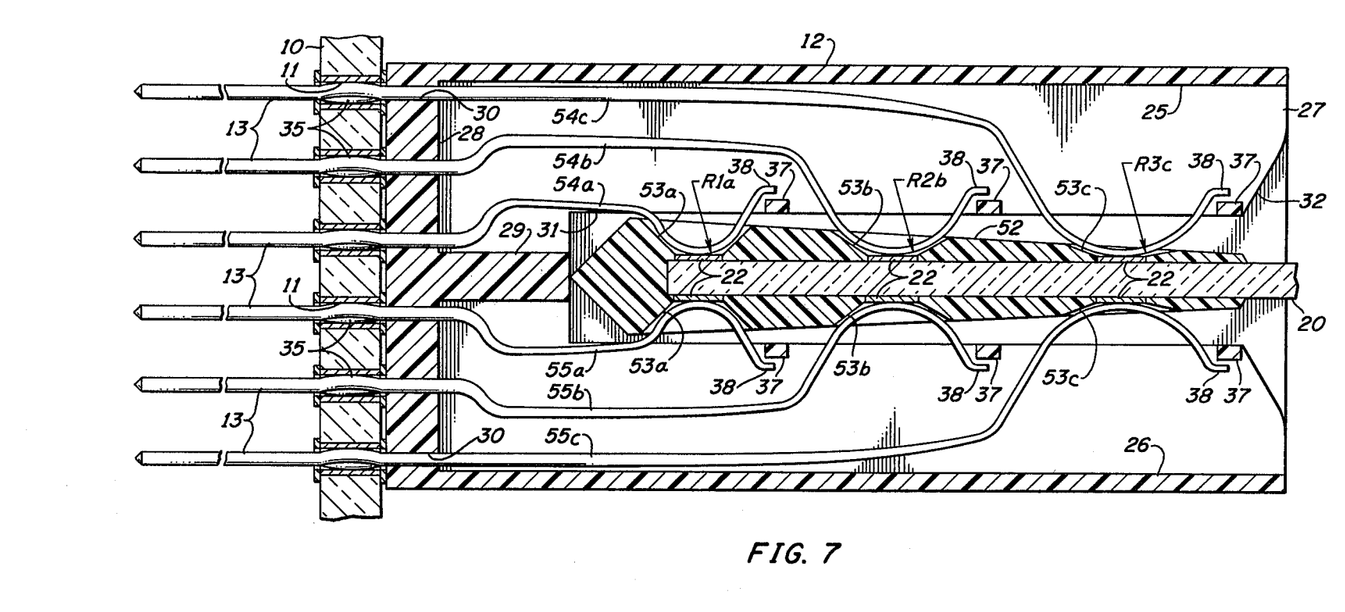
FIG. 7 is an enlarged section view of a third specific illustrative connector arrangement according to the principles of this invention.
Figure 8:
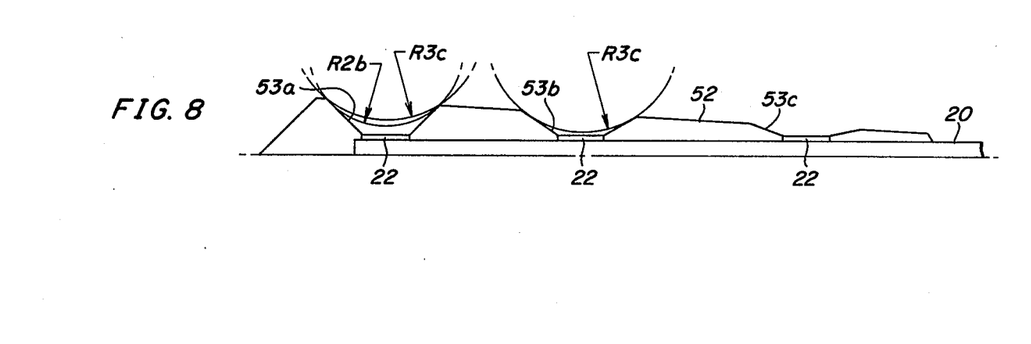
FIG. 8 is a diagrammatic partial view of the mask of the arrangement of FIG. 7 showing the relationship of the spring curvature and mask aperture dimensions.

In another specific illustrative embodiment within the scope of the invention, the radii of curvature of the contact portions of the housing contact springs again increase inwardly along the rows of contact areas from the leading edge of the board, the widths of the contact portions remaining constant. In this case, selective electrical contact is achieved by progressively flattening a taper of the mask aperture walls in conjunction with a gradual decrease in mask thickness inwardly from the leading edge of the printed wiring boards. Thus, as shown in FIG. 7, a mask 52 having a decreasing thickness is mounted on the leading portion of board 20. Mask 52 is again provided with a coordinate array of apertures 53 arranged and spaced to correspond to the array of contact areas 22 of board 20. The decreasing thickness of mask 52 together with walls of progressively flatter taper of apertures 53 achieve the selective admittance of the contact portions of varying curvature of the contact springs. With the radii R1a, R2b, and R3c of representative springs 54a, 54b, and 54c, respectively, determined as mentioned in the foregoing, it is apparent, as indicated in the diagram of FIG. 8, that the curvature of springs 54c and 55c, i.e., R3c, and the taper of the aperture walls prevents their admittance through apertures 53a and 53b of mask 52 and hence, electrical contact with the underlying contact areas 22 of board 20. Similarly, the curvature of springs 54b and 55b, i.e., R2b, and the steepest taper of the aperture walls, prevents their admittance through apertures 53a of mask 52 and, hence, electrical contact with the underlying contact areas of board 20 at those points. As is the case with the embodiments described in the foregoing, here too the opposing tiers of springs 54 and 55 can make simultaneous contact with their corresponding printed wiring board contact areas only when the board is fully inserted therebetween.

What have been described are considered to be only specific illustrative embodiments of the interconnection apparatus according to the invention and it will be appreciated that various and numerous other arrangements may be devised by one skilled in the art without departing from the spirit and scope of the invention. Thus, for example, although housings were described enclosing and mounting the spring tiers, in particular system applications, the invention may be practiced by the association of a printed wiring board and bared tiers of contact springs. Similarly, although double tiers of springs operating in conjunction with contact areas on opposite sides of a printed wiring board were contemplated in the embodiments described, it will further be appreciated that the scope of the invention includes arrangements in which a tier of springs operate on contact areas on only one side of the board. Accordingly, the scope of the invention is to be understood as limited only as defined in the accompanying claims.

What is claimed is:

1. Electrical interconnection apparatus comprising an electrical component (20) having at least a row of contact areas (22) affixed to a flat surface thereof along a first axis and a row of contact springs (e.g., 33), each of said springs corresponding to one of said contact areas (22), said springs having curved contact surfaces adapted for engaging said contact areas (22), characterized in an insulative mask (e.g., 23) overlying said row of contact areas (22), said mask having a row of apertures (e.g., 24) corresponding to said contact areas (22) for permitting electrical contact with each of said contact areas (22) by said curved contact surface of the corresponding one of said springs (e.g., 33) and guide means (31) for guiding said component (20) and said mask along said axis into sliding engagement with said contact spring surfaces and in that said apertures and said contact surfaces are correspondingly, individually dimensioned so that said contact areas and said springs are maintained apart by said mask until corresponding contact areas and springs are in opposition.

2. Electrical interconnection apparatus as claimed in claim 1 characterized in that said mask apertures (24) are substantially rectangular and progressively increase in length along said row of apertures and said curvatures of said contact surfaces of said springs progressively increase in radii along said row of springs.

3. Electrical interconnection apparatus as claimed in claim 1 characterized in that said mask (40) apertures (41) are substantially rectangular and progressively increase in width along said row of apertures and said contact surfaces of said springs progressively increase in width along said row of springs.

4. Electrical interconnection apparatus as claimed in claim 1 characterized in that said mask (52) apertures (53) are substantially rectangular, said mask progressively decrease in thickness along said row of apertures, the walls of said apertures are tapered, the taper of said walls being progressively flatter along said row of apertures and said curvatures of said contact surfaces of said springs progressively increase in radii along said row of springs.

5. Electrical interconnection apparatus as claimed in claim 1, 2, 3, or 4 characterized in that said electrical component (20) comprises a printed wiring board.

6. Electrical interconnection apparatus comprising an electrical component (20) having first and second spaced-apart contact areas (22) affixed to a surface thereof along a first axis and first and second contact springs (e.g., 33), said springs having curved contact surfaces equally spaced with said contact areas for engaging, respectively, said first and second contact areas when said component and said springs are moved relative to each other along said axis, characterized in an insulative mask (e.g., 23) overlying said contact areas, said mask having a first and a second substantially rectangular aperture (24) opening, respectively, on said first and second contact areas, and in that said first aperture and the contact surface of said first spring are dimensioned with respect to the dimensions of said second aperture and the contact surface of said second spring such that said first spring is maintained apart from said second contact area by said mask when said component (20) and said springs are moved relative to each other along said axis and such that electrical contact is permitted between said first spring and said first contact area.

7. Electrical interconnection apparatus comprising an electrical component (20) having first and second spaced-apart contact areas (22) affixed to a surface thereof along a first axis and first and second contact springs (33c, 33b), said springs having curved contact surfaces equally spaced with said contact areas for engaging, respectively, said first and second contact areas when said component and said springs are moved relative to each other along said axis, characterized in an insulative mask (23) overlying said contact areas, said mask having a first and a second substantially rectangular aperture (24c, 24b) opening, respectively, on said first and second contact area and in that the radius of curvature of the contact surface of said first spring (33c) is greater than the radius of curvature of the contact surface of said second spring (33b), the length of said first aperture (24c) along said axis being determined to permit electrical contact between said first spring (33c) and said first contact area, the length of said second aperture (24b) along said axis being determined as less than the length of said first aperture such that said first spring (33c) is maintained apart from said second contact area by said mask when said component (20) and said springs (33c, 33b) are moved relative to each other along said axis and such that said second aperture (24b) permits electrical contact between said second spring (33b) and said second contact area.

8. Electrical interconnection apparatus comprising an electrical component (20) having first and second spaced-apart contact areas (22) affixed to a surface thereof along a first axis and first and second contact springs (42c, 42b), said springs having contact surfaces equally spaced with said contact areas for engaging, respectively, said first and second contact areas when said component and said springs are moved relative to each other along said axis, characterized in an insulative mask (40) overlying said contact areas, said mask having a first and a second substantially rectangular aperture (41c, 41b) opening, respectively, on said first and second contact areas and in that the width of the contact surface of said first spring (42c) across said axis is greater than the same width of the contact surface of said second spring (42b), the width of said first aperture (41c) across said axis being determined to permit electrical contact between said first spring (42c) and said first contact area, the same width of said second aperture (41b) being determined as less than said width of said first aperture such that said first spring (42c) is maintained apart from said second contact area by said mask when said component (20) and said springs (42c, 42b) are moved relative to each other along said axis and such that said second aperture (41b) permits electrical contact between said second spring (42b) and said second contact area.

9. Electrical interconnection apparatus comprising an electrical component (20) having first and second spaced-apart contact areas (22) affixed to a surface thereof along a first axis and first and second contact springs (54c, 54b), said springs having curved contact surfaces equally spaced with said contact areas for engaging, respectively, said first and second contact areas when said component and said springs are moved relative to each other along said axis, characterized in an insulative mask (52) overlying said contact areas, said mask having a first and a second substantially rectangular aperture (53c, 53b) each having outwardly tapered walls, said apertures opening, respectively, on said first and second contact area and in that the radius of curvature of the contact surface of said first spring (54c) is greater than the radius of curvature of the contact surface of said second spring (54b), said mask (52) progressively reducing in thickness along said axis from said second aperture to said first aperture (53b, 53c), the walls of said first aperture (53c) being tapered to permit electrical contact between said first spring (54c) and said first contact area, the walls of said second aperture (53b) being more steeply tapered than the walls of said first aperture such that said first spring (54c) is maintained apart from said second contact area by said mask when said component (20) and said springs (54c, 54b) are moved relative to each other along said axis and such that said second aperture (53b) permits electrical contact between said second spring (54b) and said second contact area.

10. Electrical interconnection apparatus comprising a printed wiring board (20) having a first and a second plurality of contact areas (22) affixed, respectively, to opposite sides of a leading portion (21) of said board (20) and a first and a second plurality of contact springs (e.g., 33, 34), each spring corresponding to one of said contact areas, said springs having curved contact surfaces for engaging said contact areas as said board is moved between said first and second plurality of springs, characterized in that said first and second plurality of contact areas (22) and said first and second plurality of contact springs (33, 34) are arranged in corresponding rows and columns, said rows being in the direction of movement of said board between said last-mentioned pluralities of contact springs, and in that an insulative mask (e.g., 23) overlies said first and second plurality of contact areas (22), said mask having rows and columns of substantially rectangular apertures (e.g., 24) on each side of said board (20) corresponding to said rows and columns of said first and second plurality of contact areas for permitting electrical contact with each of said contact areas by the corresponding one of said contact springs, said apertures (24) and said contact surfaces of said springs of said rows on each side of said board are correspondingly and individually dimensioned so that said contact areas and said springs are maintained apart by said mask until corresponding contact areas and springs are moved into final opposition by the relative movement of said board (20) and said springs.

11. Electrical interconnection apparatus as claimed in claim 10 characterized in that said mask apertures (24) progressively increase in length along said rows of apertures and said curvatures of said contact surfaces of said first and second plurality of contact springs (33, 34) progressively increase in radii along said rows of springs.

12. Electrical interconnection apparatus as claimed in claim 10 characterized in that said mask (40) apertures (41) progressively increase in width along said rows of apertures and said contact surfaces of said springs of said first and second plurality of springs (42, 43) progressively increase in width along said rows of springs.

13. Electrical interconnection apparatus as claimed in claim 10 characterized in that said mask (52) progressively decreases in thickness along said rows of apertures (53), the walls of said apertures are tapered, the taper of said walls being progressively flatter along said rows of apertures and said curvatures of said contact surfaces of said springs of said first and second plurality of springs (54, 55) progressively increase in radii along said rows of springs.

14. A circuit board (20) for mounting electrical components, said board having a plurality of terminal contact areas (22) affixed thereto aligned in a row along a first axis, said axis being substantially perpendicular to a leading edge of said board, each of said contact areas being adapted for sliding engagement with a corresponding one of a plurality of contact springs as said board is moved relative to said springs along said axis, each of said springs being uniquely dimensioned, characterized in an insulative mask (e.g., 23) overlying said contact areas (22), said mask having a plurality of apertures (e.g., 24) therein aligned in a row, said plurality of apertures corresponding to said plurality of contact areas (22), for permitting electrical contact with each of said contact areas by the corresponding one of said springs and in that each of said apertures is uniquely dimensioned so that said contact areas and said springs are maintained apart by said mask until corresponding contact areas and springs are moved into final opposition by the movement of said board relative to said springs along said axis.

15. A circuit board (20) as claimed in claim 14 characterized in that said apertures (24) progressively increase in length along said row of apertures.

16. A circuit board (20) as claimed in claim 14 characterized in that said apertures (41) progressively increase in width along said row of apertures.

17. A circuit board (20) as claimed in claim 14 characterized in that said mask (52) progressively decreases in thickness along said row of apertures (53) and in that said apertures (53) having walls of increasing taper along said row of apertures (53).

* * * * *